(12) United States Patent
Deguchi et al.

(10) Patent No.: US 9,258,009 B2
(45) Date of Patent: Feb. 9, 2016

(54) AD CONVERTER

(71) Applicant: RENESAS ELECTRONICS CORPORATION, Kanagawa (JP)

(72) Inventors: Kazuaki Deguchi, Kawasaki (JP); Masao Ito, Kawasaki (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 14/435,940

(22) PCT Filed: Oct. 17, 2012

(86) PCT No.: PCT/JP2012/076811
§ 371 (c)(1),
(2) Date: Apr. 15, 2015

(87) PCT Pub. No.: WO2014/061117
PCT Pub. Date: Apr. 24, 2014

(65) Prior Publication Data
US 2015/0270846 A1    Sep. 24, 2015

(51) Int. Cl.
*H03M 1/38* (2006.01)
*H03M 1/46* (2006.01)
*H03M 1/12* (2006.01)
(Continued)

(52) U.S. Cl.
CPC .............. *H03M 1/462* (2013.01); *H03K 5/159* (2013.01); *H03M 1/002* (2013.01); *H03M 1/0624* (2013.01); *H03M 1/125* (2013.01); *H03M 1/38* (2013.01)

(58) Field of Classification Search
CPC ..... H03M 1/002; H03M 1/38; H03M 1/0624; H03M 1/462; H03M 1/125; H03M 1/159; H03M 1/46; H03M 1/0675
USPC .................. 341/110, 155, 160, 161, 165, 166
See application file for complete search history.

(56) References Cited

U.S. PATENT DOCUMENTS 5,801,657 A * 9/1998 Fowler .................. H03M 1/123
                                                            341/155
6,157,338 A    12/2000 Gross, Jr.
(Continued)

FOREIGN PATENT DOCUMENTS

JP    2000-295106 A    10/2000
JP    2010-45579 A     2/2010
(Continued)

OTHER PUBLICATIONS

English Translation International Search Report PCT/JP2012/076811 dated Nov. 20, 2012.
(Continued)

*Primary Examiner* — Lam T Mai
(74) *Attorney, Agent, or Firm* — McDermott Will & Emery LLP

(57) ABSTRACT

A successive approximation type AD converter includes: a comparator comparing an analog input signal and a DA-converted comparison code; and a control circuit. When an output of the comparator settles before a limit time period has passed since the comparator started a comparison operation, the control circuit updates the comparison code on the basis of the settled output of the comparator. When the limit time period has passed before the output of the comparator settles, the control circuit updates the comparison code not on the basis of the present output of the comparator.

13 Claims, 11 Drawing Sheets

(51) Int. Cl.
  *H03K 5/159* (2006.01)
  *H03M 1/00* (2006.01)
  *H03M 1/06* (2006.01)

(56) References Cited

U.S. PATENT DOCUMENTS

| | | | |
|---|---|---|---|
| 7,535,391 B1 * | 5/2009 | Newman | H03M 1/0673 341/131 |
| 7,994,960 B1 * | 8/2011 | Li | H03M 1/0678 341/155 |
| 2009/0009373 A1 * | 1/2009 | Yoshinaga | H03M 1/1071 341/143 |
| 2010/0013693 A1 | 1/2010 | Kuramochi et al. | |
| 2010/0283645 A1 * | 11/2010 | Haneda | H03M 1/0639 341/122 |
| 2012/0112938 A1 * | 5/2012 | Haneda | H03M 1/12 341/110 |
| 2013/0009796 A1 | 1/2013 | Sakiyama et al. | |
| 2013/0135125 A1 * | 5/2013 | Schreiner | H03M 1/462 341/110 |
| 2013/0265180 A1 * | 10/2013 | Matsumoto | H03M 1/0697 341/110 |
| 2014/0232576 A1 * | 8/2014 | Sim | H03M 1/1061 341/118 |

FOREIGN PATENT DOCUMENTS

| | | |
|---|---|---|
| JP | 2011-061597 A | 3/2011 |
| JP | 2011-211371 A | 10/2011 |
| JP | 2012-039475 A | 2/2012 |
| WO | 2010/010661 A1 | 1/2010 |
| WO | 2011/121683 A1 | 10/2011 |

OTHER PUBLICATIONS

Shuo-Wei Michael Chen et al., "A 6-bit 600-MS/s 5.3-mW Asynchronous ADC in 0.13-μm CMOS", IEEE Journal of Solid-State Circuits, vol. 41, No. 12, Dec. 2006, pp. 2669-2680.

\* cited by examiner

FIG.5

| CYCLE | 1 | 2 | 3 | 4 | 5 |
|---|---|---|---|---|---|
| 31 | | | | | |
| 30 | | | | | ▬ |
| 29 | | | | ▬ | |
| 28 | | | | | ▬ |
| 27 | | | ▬ | | |
| 26 | | | | | ▬ |
| 25 | | | | ▬ | |
| 24 | | | | | ▬ |
| 23 | | ▬ | | | |
| 22 | | | | | ▬ |
| 21 | | | | ▬ | |
| 20 | | | | | ▬ |
| 19 | | | ▬ | | |
| 18 | | | | | ▬ |
| 17 | | | | ▬ | |
| 16 | | | | | ▬ |
| 15 | ▬ | | | | |
| 14 | | | | | ▬ |
| 13 | | | | ▬ | |
| 12 | | | | | ▬ |
| 11 | | | ▬ | | |
| 10 | | | | | ▬ |
| 9 | | | | ▬ | |
| 8 | | | | | ▬ |
| 7 | | ▬ | | | |
| 6 | | | | | ▬ |
| 5 | | | | ▬ | |
| 4 | | | | | ▬ |
| 3 | | | ▬ | | |
| 2 | | | | | ▬ |
| 1 | | | | ▬ | |
| 0 | | | | | ▬ |

8.1 — (dashed line between rows 8 and 7)

AD CONVERTER

CROSS REFERENCE TO RELATED APPLICATIONS

This Application is the U.S. National Phase of PCT/JP2012/076811 filed Oct. 17, 2012 the subject matter of which is incorporated herein by reference in entirety.

TECHNICAL FIELD

The present invention relates to an AD (Analog-to-Digital) converter, and is suitably used for an asynchronous successive approximation type AD converter, for example.

BACKGROUND ART

A successive approximation type AD converter typically serves to convert an analog input signal into a binary digital value by a binary search method. The successive approximation type AD converter is classified roughly into a synchronous type and an asynchronous type.

In the synchronous AD converter, a sampling clock used for determining a sampling period are generated based on the externally supplied clock and a timing clock used for controlling the operation of a comparator. The AD converter operates in synchronization with these clocks. Since the synchronous AD converter requires a circuit for generating these clocks and also requires wiring lines for clocks to extend therein, the consumption current becomes relatively large and the circuit is increased in area.

The asynchronous AD converter serves to start the comparison operation in the next cycle based on the signal showing that a comparison operation has been completed, and thus, does not require supply of a clock signal in a constant cycle. Accordingly, the power consumption and the area can be reduced as compared with the case of the synchronous AD converter (for example, see "A 6-bit 600-MS/s 5.3-mW Asynchronous ADC in 0.13-μm CMOS" by Chen, et. al., IEEE Journal of Solid-State Circuits, Vol. 41, December in 2006, pages 2669 to 2680 (Non-Patent Document 1)).

According to the asynchronous-type AD converter, however, as the absolute value of the potential difference between the input analog signal and the reference signal becomes smaller, the time until the output signal of the comparator settles becomes longer. In the case where the absolute value of the potential difference between both signals is extremely small, the required number of comparison for one AD conversion cannot be carried out to the end, thereby leading to an extremely large AD conversion error.

Japanese Patent Laying-Open No. 2010-45579 (PTD 1) discloses a comparison circuit configured to shorten a determination time period. Specifically, when comparing an input signal and a reference signal, the comparison circuit in this document generates the first comparison value larger than the reference signal by a predetermined value and the second comparison value smaller than the reference signal by the predetermined value. The comparison circuit includes: the first comparator generating the first determination signal in accordance with the result obtained by comparing the input signal and the first comparison value; and the second comparator generating the second determination signal in accordance with the result obtained by comparing the input signal and the second comparison value. The comparison circuit further includes an output selection circuit: detecting one of the first determination signal and the second determination signal that is first generated; and selecting the first generated signal to output the selected signal as a determination signal.

CITATION LIST

Patent Document

PTD 1: Japanese Patent Laying-Open No. 2010-45579

Non Patent Document

NPD 1: S. M. Chen and R. W. Brodersen, "A 6-bit 600-MS/s 5.3-mW Asynchronous ADC in 0.13-μm CMOS", IEEE Journal of Solid-State Circuits, Vol. 41, December in 2006, pages 2669 to 2680.

SUMMARY OF INVENTION

Technical Problem

According to the successive approximation type AD converter including a comparison circuit disclosed in the above-mentioned Japanese Patent Laying-Open No. 2010-45579 (PTD 1), a reference signal is obtained by DA (Digital-to-Analog)-converting a comparison code generated in a successive approximation register. The first comparison value and the second comparison value mentioned above are generated by adding a positive/negative predetermined analog voltage to this analog reference signal. Accordingly, the first and second comparison values are to include errors associated with addition of an analog voltage, which leads to a problem that the final AD conversion error becomes relatively large. If two DA converters are provided for generating the first and second comparison values, addition of an analog voltage becomes unnecessary, which however causes an increase in the circuit area.

Other problems and novel features will become apparent from the description of the present specification and the accompanying drawings.

Solution to Problem

A successive approximation type AD converter according to one embodiment includes: a comparator comparing an analog input signal and a DA-converted comparison code; and a control circuit. When an output of the comparator settles before a limit time period has passed since the comparator started a comparison operation, the control circuit updates the comparison code on the basis of the settled output of the comparator. When the limit time period has passed before the output of the comparator settles, the control circuit updates the comparison code not on the basis of a present output of the comparator.

Advantageous Effects of Invention

According to the AD converter in one embodiment described above, even when the absolute value of the input potential difference of the comparator becomes extremely small, an AD conversion value with a relatively small error can be obtained within a desired period of time.

BRIEF DESCRIPTION OF DRAWINGS

FIG. 5 is a diagram for illustrating the conversion operation by the AD converter in the first embodiment.

DESCRIPTION OF EMBODIMENTS

Figure 1:
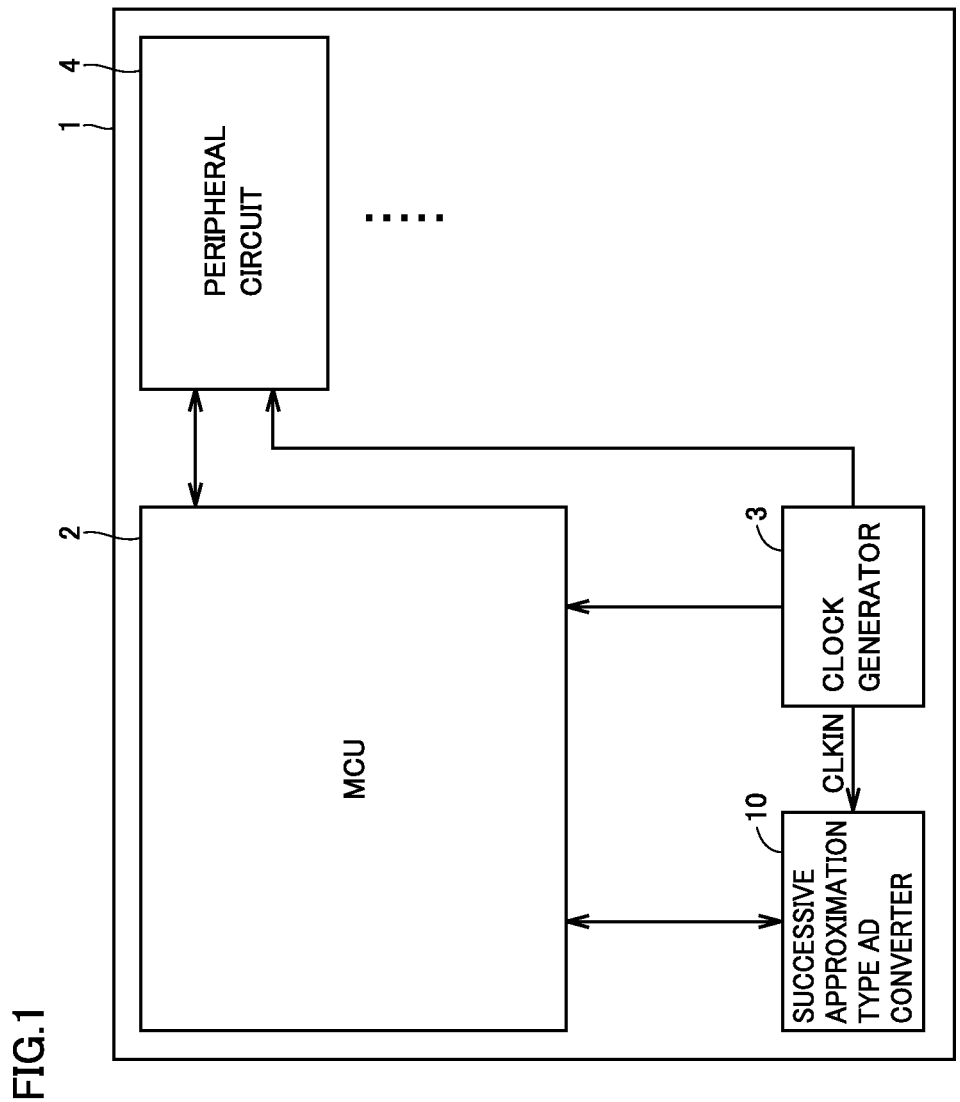
FIG. 1 is a block diagram schematically showing one example of the entire configuration of a semiconductor device including an AD converter according to the first embodiment.

Each embodiment will be hereinafter described in detail with reference to the accompanying drawings, in which the same or corresponding components are designated by the same reference characters, and description thereof will not be repeated.

First Embodiment

Configuration Example of Semiconductor Device

FIG. 1 is a block diagram schematically showing one example of the entire configuration of a semiconductor device including an AD converter according to the first embodiment.

Referring to FIG. 1, a semiconductor device 1 includes a micro control unit (MCU) 2, a successive approximation type AD converter 10, a clock generator 3, other peripheral circuits 4, a power supply circuit that is not shown, and the like. MCU 2 includes a CPU (Central Processing Unit) core, a memory, a timer, an input/output interface, and the like. AD converter 10 and other peripheral circuits 4 are connected to MCU 2 and controlled by this MCU 2. Clock generator 3 generates a clock used as a reference of the operation of semiconductor device 1, and supplies the clock to each unit.

[Configuration of AD Converter]

Figure 2:
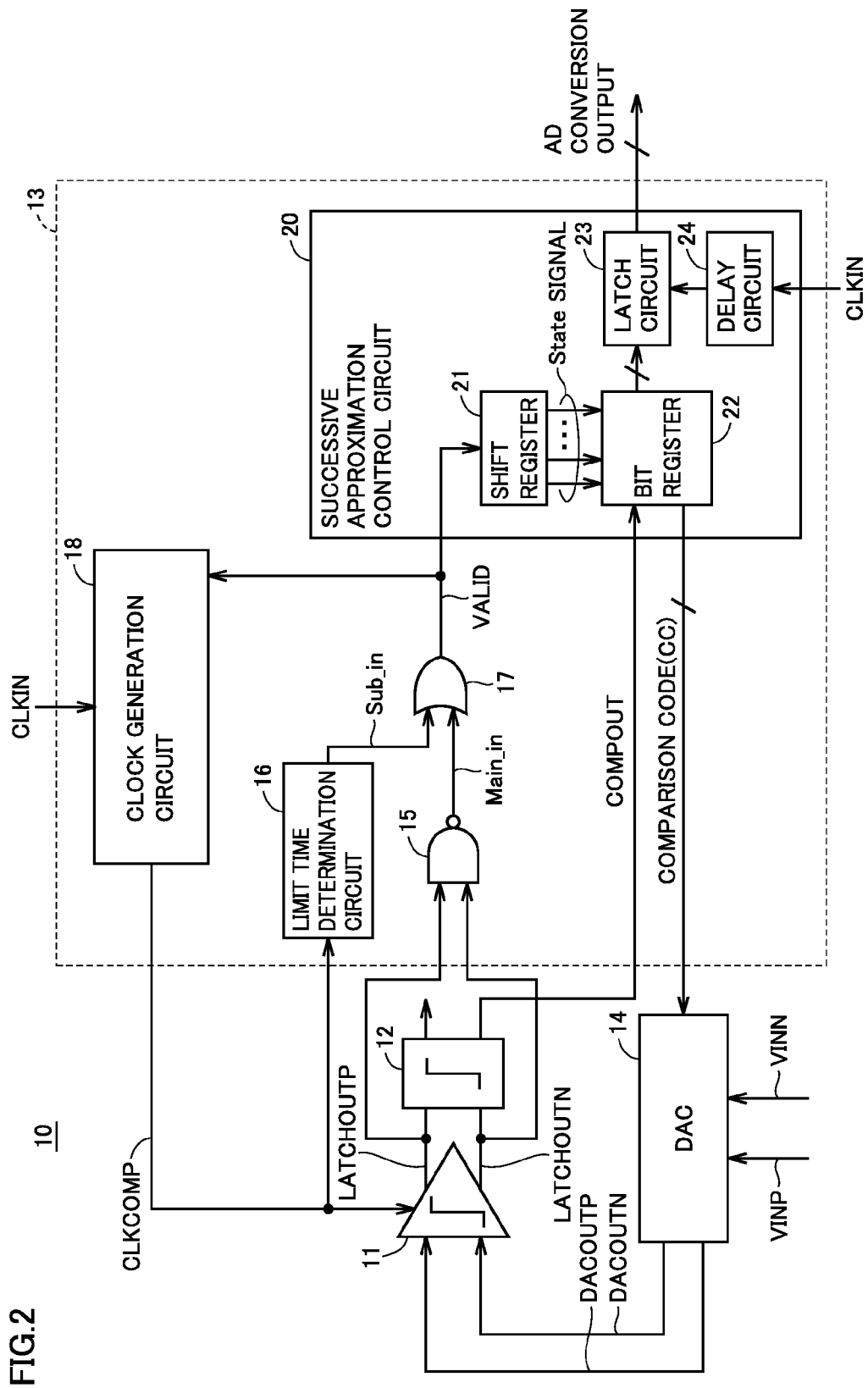
FIG. 2 is a block diagram showing the configuration of the AD converter in FIG. 1.

FIG. 2 is a block diagram showing the configuration of the AD converter in FIG. 1. Referring to FIG. 2, AD converter 10 is an asynchronous successive approximation type AD converter. AD converter 10 includes a DA converter (DAC: Digital-to-Analog Converter) 14, a comparator 11 provided with a latch circuit, an SR (Set-Reset) latch circuit 12, and a control circuit 13.

1. DA Converter 14

DA converter 14 serves to DA-convert a comparison code CC output from control circuit 13. DA converter 14 generates a differential signal DACOUT (a positive phase signal DACOUTP and a negative phase signal DACOUTN) showing the potential difference between a sampled analog input signal VIN (a positive phase signal VINP and a negative phase signal VINN) and DA-converted comparison code CC, and outputs the generated differential signal DACOUT to comparator 11.

DA converter 14 may be configured as a capacity DAC, as a combination of a capacity main DAC and a resistance sub DAC, or as a resistance DAC.

2. Comparator and SR Latch Circuit 2.1 Outline

Comparator 11 is implemented by adding the function of a latch circuit to a complete differential amplifier having a differential input and a differential output. Comparator 11 receives differential signal DACOUT (positive phase signal DACOUTP and negative phase signal DACOUTN) output from DA converter 14. In accordance with the value of differential input signal DACOUT, comparator 11 generates and outputs a differential signal LATCHOUT so as to cause one of positive phase signal LATCHOUTP and negative phase signal LATCHOUTN to attain an H level (high level) and to cause the other of these positive and negative phase signals to attain an L level (low level). Differential output signal LATCHOUT is held in SR latch circuit 12 and output to control circuit 13.

As another option, sampled input signal VIN and DA-converted comparison code CC each may be input into comparator 11 as a single-ended signal, and comparator 11 may be configured to output differential signal LATCHOUT in accordance with the potential difference between both of the input single-ended signals.

A clock signal CLKCOMP is further input into comparator 11. When clock signal CLKCOMP is asserted, comparator 11 starts a comparison operation. When clock signal CLKCOMP is negated, comparator 11 is reset. In the first embodiment, clock signal CLKCOMP is defined as an H active signal, in which clock signal CLKCOMP is asserted at the H level and negated at the L level. Needless to say, clock signal CLKCOMP may be defined as an L active signal.

In the first embodiment, positive phase signal LATCHOUTP and negative phase signal LATCHOUTN output from reset comparator 11 each are at an H level. When clock signal CLKCOMP is asserted, one of positive phase signal LATCHOUTP and negative phase signal LATCHOUTN changes into an L level in accordance with the value of differential input signal DACOUT.

2.2 Detailed Example of Circuit Configuration

Figure 3:
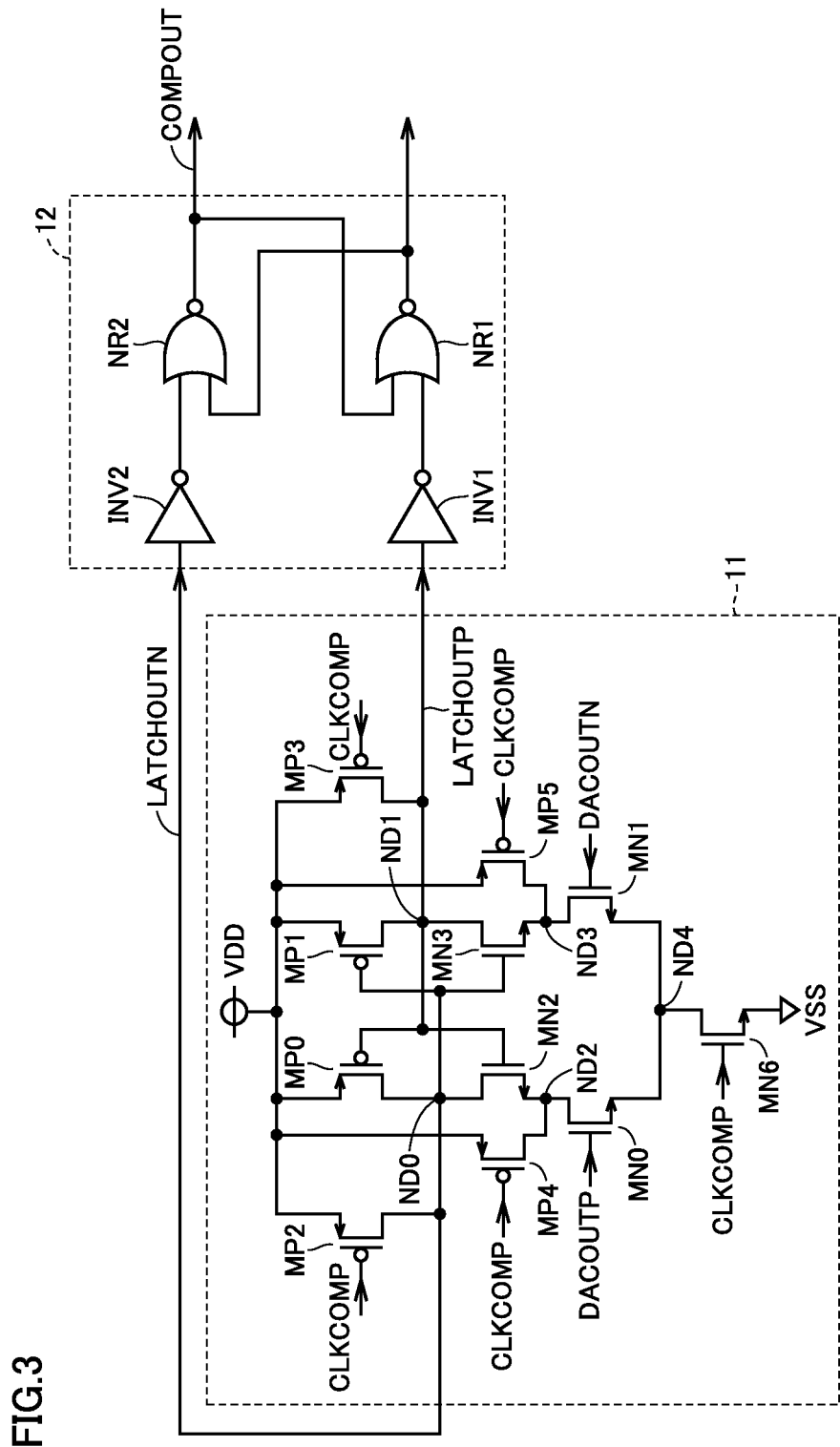
FIG. 3 is a circuit diagram showing one example of the configuration of each of a comparator and an SR latch circuit in FIG. 2.

FIG. 3 is a circuit diagram showing one example of the configuration of each of the comparator and the SR latch circuit in FIG. 2. Referring to FIG. 3, comparator 11 includes PMOS (Positive-channel Metal Oxide Semiconductor) transistors MP0 to MP5, and NMOS (Negative-channel Metal Oxide Semiconductor) transistors MN0 to MN3 and MN6.

PMOS transistor MP0 and NMOS transistors MN2 and MN0 are connected in this order in series between a power supply node VDD and a node ND4. PMOS transistor MP1 and NMOS transistors MN3 and MN1 are connected in this order in series between power supply node VDD and node ND4, and also connected in parallel with transistors MP0, MN2 and MN0 that are connected in series. NMOS transistors MN0 and MN1, which form a differential pair, have gates receiving output signals DACOUTP and DACOUTN, respectively, from DA converter 14 in FIG. 2. PMOS transistor MP0 and NMOS transistor MN2 each have a gate connected to a connection node ND1 between PMOS transistor MP1 and NMOS transistor MN3 (a non-inversion output node of comparator 11). PMOS transistor MP1 and NMOS transistor MN3 each have a gate connected to a connection node ND0 between PMOS transistor MP0 and NMOS transistor MN2 (an inversion output node of comparator 11). Thereby, transistors MP0, MP1, MN2, and MN3 form a latch circuit. Positive phase signal LATCHOUTP is output from connection node ND1 (the non-inversion output node of comparator 11), and negative phase signal LATCHOUTN is output from connection node ND0 (the inversion output node of comparator 11).

An NMOS transistor MN6 is connected between node ND4 and a ground node VSS. NMOS transistor MN6 has a gate into which clock signal CLKCOMP is input. When clock signal CLKCOMP is at an L level, NMOS transistor MN6 is turned off. When clock signal CLKCOMP is at an H level, NMOS transistor MN6 is turned on and functions as a constant current source.

PMOS transistor MP2 is connected between power supply node VDD and connection node ND0 while PMOS transistor MP3 is connected between power supply node VDD and connection node ND1. PMOS transistor MP4 is connected between power supply node VDD and a connection node ND2 of NMOS transistors NM2 and MN0. PMOS transistor MP5 is connected between power supply node VDD and a connection node ND3 of NMOS transistors MN3 and MN1. These PMOS transistors MP2 to MP5 each have a gate into which clock signal CLKCOMP is input. When clock signal CLKCOMP is at an H level, PMOS transistors MP2 to MP5 are brought into an OFF state (comparator 11 is in an operating state). When clock signal CLKCOMP is at an L level, PMOS transistors MP2 to MP5 are brought into an ON state (comparator 11 is in a reset state), in which case output nodes ND1 and ND0 of comparator 11 are fixed at an H level.

SR latch circuit 12 includes: inverters INV1 and INV2 receiving output signals LATCHOUTP and LATCHOUTN, respectively, of comparator 11; and NOR gates NR1 and NR2. NOR gate NR1 outputs a signal obtained by inverting an OR operation result of the output signal of inverter INV1 and the output signal of NOR gate NR2. NOR gate NR2 outputs a signal obtained by inverting an OR operation result of the output signal of inverter INV2 and the output signal of NOR gate NR1. The output signal of NOR gate NR2 is output to control circuit 13 as an output signal COMPOUT of the SR latch circuit.

When clock signal CLKCOMP is negated, that is, when output signals LATCHOUTP and LATCHOUTN of comparator 11 each are at an H level, the internal state of SR latch circuit 12 does not change and the logic level of output signal COMPOUT does not change. When clock signal CLKCOMP is asserted, comparator 11 outputs differential signal LATCHOUT according to differential input signal DACOUTP to SR latch circuit 12. When input positive phase signal DACOUTP of comparator 11 is larger than input negative phase signal DACOUTN, output positive phase signal LATCHOUTP is maintained at an H level while output negative phase signal LATCHOUTN changes into an L level. At this time, output signal COMPOUT of SR latch circuit 12 attains an L level. When input positive phase signal DACOUTP of comparator 11 is smaller than input negative phase signal DACOUTN, output positive phase signal LATCHOUTP changes into an L level while output negative phase signal LATCHOUTN is maintained at an H level. At this time, output signal COMPOUT of SR latch circuit 12 attains an H level.

2.3 Modification of FIG. 3

In comparator 11 in FIG. 3, power supply node VDD and ground node VSS may be replaced with each other, each PMOS transistor may be replaced with an NMOS transistor, and each NMOS transistor may be replaced with a PMOS transistor. In this case, SR latch circuit 12 is formed only of NOR gates NR1 and NR2 without including inverters INV1 and INV2.

In the case of the above-described configuration, comparator 11 receives a signal obtained by inverting the logic level of clock signal CLKCOMP. When clock signal CLKCOMP is negated, output signals LATCHOUTP and LATCHOUTN of comparator 11 each attain an L level. When clock signal CLKCOMP is asserted, in comparator 11, one of output signals LATCHOUTP and LATCHOUTN changes into an H level in accordance with differential input signal DACOUT. In response to this change of differential output signal LATCHOUT, the internal state of SR latch circuit 12 changes.

3. Control Circuit

Again referring to FIG. 2, control circuit 13 includes: a logic gate (NAND gate) 15 for determining whether the output of comparator 11 has settled or not; a limit time determination circuit 16; a logic gate (OR gate) 17; a clock generation circuit 18; and a successive approximation control circuit 20.

3.1 Logic Gate (NAND Gate) 15

Logic gate 15 serves as a 2-input NAND circuit that performs a NAND operation for output signals LATCHOUTP and LATCHOUTN of comparator 11. When clock signal CLKCOMP is negated, output signals LATCHOUTP and LATCHOUTN of comparator 11 each are at an H level. Accordingly, an output signal Main_in of logic gate 15 attains an L level. When clock signal CLKCOMP is asserted and one of NANDs of output signals LATCHOUTP and LATCHOUTN from comparator 11 changes into an L level (that is, when the output of comparator 11 settles), output signal Main_in of logic gate 15 changes into an H level. In the first embodiment, output signal Main_in of the logic gate is defined as H active.

In summary, logic gate 15 functions as a determination unit that determines whether the output of comparator 11 has settled or not. When the output of comparator 11 settles, output signal (determination signal) Main_in of logic gate 15 changes from an L level into an H level (asserted).

As another option, as described in the above 2.3, when output signals LATCHOUTP and LATCHOUTN of comparator 11 in the reset state each are at an L level, logic gate 15 is formed, for example, by an OR gate.

3.2 Limit Time Determination Circuit

When a limit time period has passed since clock signal CLKCOMP was asserted, a limit time determination circuit 16 changes an output signal Sub_in from an L level into an H level (in the first embodiment, output signal Sub_in of limit time determination circuit 16 is defined as H active). In other words, limit time determination circuit 16 functions as a determination unit that determines whether the limit time period has passed or not since clock signal CLKCOMP was asserted. When the limit time period has passed, output signal (determination signal) Sub_in of limit time determination circuit 16 changes from an L level into an H level (asserted).

When clock signal CLKCOMP is negated, limit time determination circuit 16 immediately sets output signal Sub_in back to an L level (negates) in order not to exert an influence upon the operation of successive approximation control circuit 20.

3.3 Logic Gate (OR Gate) 17

When at least one of output signal Main_in of logic gate 15 and output signal Sub_in of limit time determination circuit 16 is asserted, logic gate (OR gate) 17 asserts an output signal VALID (in the first embodiment, the VALID signal is defined as H active).

In general, as the absolute value of the potential difference between sampled input signal VIN and DA-converted comparison code CC (that is, the input potential difference of comparator 11) becomes smaller, the time until the output of comparator 11 settles becomes longer. The above-mentioned limit time period is set in order to avoid such a situation that AD conversion of all bits cannot be completed in the case where the absolute value of the input potential difference is extremely small. Even if the output of comparator 11 does not settle, the VALID signal is asserted when the limit time period has passed since clock signal CLKCOMP was asserted (that is, since comparator 11 started a comparison operation). In response to this VALID signal, clock generation circuit 18 and successive approximation control circuit 20 proceeds to the next cycle.

The limit time period is determined depending on the bit accuracy of AD conversion such that the required number of all comparison operations are completed during a time period until the next sampling period starts. Alternatively, the limit time period may be determined so as to proceed to the next cycle in the case where the absolute value of differential signal DACOUT input into comparator 11 is smaller than the absolute value of the quantization error of the AD converter (±0.5×LSB; note LSB: Least Significant Bit).

3.4 Clock Generation Circuit

In response to negation of clock signal CLKIN showing a sampling period (in response to the change from an H level into an L level in the first embodiment), clock generation circuit 18 asserts clock signal CLKCOMP that is to be output to comparator 11 (changes the signal from an L level into an H level). Thereby, the first comparison operation by comparator 11 is started. At this point of time, the VALID signal is negated (being at an L level).

When a predetermined time period has passed since clock generation circuit 18 detected that the VALID signal was asserted (changed from an L level into an H level), this clock generation circuit 18 negates clock signal CLKCOMP (changes the signal into an L level). Thereby, comparator 11 is changed into a reset state.

When a predetermined time period has passed since clock signal CLKCOMP was negated, clock generation circuit 18 asserts clock signal CLKCOMP (changes the signal into an H level). Thereby, the comparison operation in the next cycle is started.

3.5 Successive Approximation Control Circuit

When detecting that the VALID signal has been asserted, successive approximation control circuit 20 updates comparison code CC based on output signal COMPOUT of SR latch circuit 12. In other words, in the case where the output of comparator 11 settles before the limit time period has passed, successive approximation control circuit 20 generates comparison code CC used in the next cycle based on the comparison result of comparator 11 after settlement stored in SR latch circuit 12. When the limit time period has passed before the output of comparator 11 settles, successive approximation control circuit 20 uses the previous comparison result stored in SR latch circuit 12 as the present comparison result (that is, not based on the present output of comparator 11), to generate comparison code CC to be used in the next cycle.

In addition, as described later with reference to FIG. 5, even in the case where the limit time period has passed before the output of comparator 11 settles, the final AD conversion error results in about 1 LSB if the limit time period is appropriately set.

As shown in FIG. 2, successive approximation control circuit 20 more specifically includes a shift register 21, a bit register 22, a latch circuit 23, and a delay circuit 24. The value of shift register 21 is updated in response to the VALID signal. Each bit of shift register 21 corresponds to a State signal. The State signal shows the information as to which number of cycles the comparison operation is being performed. The value of bit register 22 is updated based on output signal COMPOUT of SR latch circuit 12 for each cycle. The contents of bit register 22 are output to DA converter 14 as comparison code CC and also stored in latch circuit 23. When the time period determined by delay circuit 24 has passed since the sampling period ended by fall of clock signal CLKIN, the digital value stored in latch circuit 23 is output as an AD conversion output.

[Operation of AD Converter]

Figure 4:
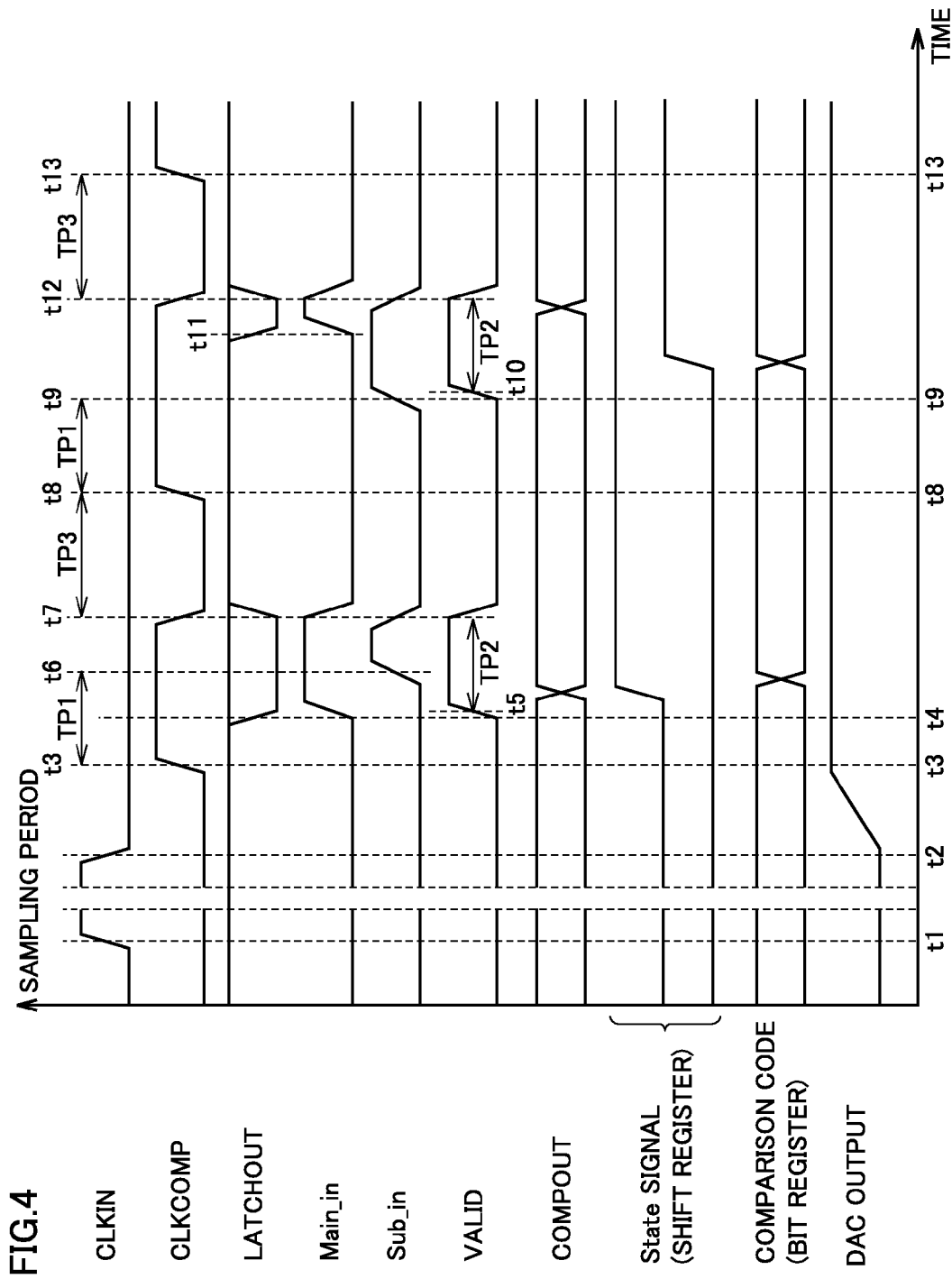
FIG. 4 is a diagram schematically showing one example of a signal waveform of each part in the AD converter in FIG. 2.

FIG. 4 is a diagram schematically showing one example of a signal waveform of each part of the AD converter in FIG. 2. FIG. 4 shows clock signal CLKIN, clock signal CLKCOMP, output signal LATCHOUT of comparator 11, output signal Main_in of logic gate 15, output signal Sub_in of limit time determination circuit 16, VALID signal, and output signal COMPOUT of SR latch circuit 12 in this order from the top. Although output signal COMPOUT is a 1-bit signal showing the value at an H level or an L level, FIG. 4 shows the signal at an H level and the signal at an L level that are overlapped with each other. FIG. 4 also shows State signals corresponding to the first bit and the second bit of shift register 21, comparison code CC, and an output signal of DA converter 14. Although not shown in FIG. 4, in fact, the output of DA converter 14 changes in accordance with the value of comparison code CC. Referring to FIGS. 2 and 4, the operation of AD converter 10 will be hereinafter collectively described.

Clock signal CLKIN attains an H level during the time period from time t1 to time t2. Differential input signals VINP and VINN are sampled during this time period.

When clock signal CLKIN falls to an L level at time t2, output signals DACOUTP and DACOUTN of DA converter 14 are input into comparator 11. Furthermore, in response to fall of clock signal CLKIN, clock generation circuit 18 changes clock signal CLKCOMP into an H level (time t3). When clock signal CLKCOMP is changed into an H level, comparator 11 starts the comparison operation in the first cycle.

At next time t4, one of positive phase signal LATCHOUTP and negative phase signal LATCHOUTN output from comparator 11 changes into an L level (that is, the output of comparator 11 settles). In response to the change of output signal LATCHOUT of comparator 11, output signal Main_in of logic gate 15 changes into an H level, and further, the VALID signal changes into an H level (time t5). In the first cycle, the timing at which the output of comparator 11 settles (time t4) is prior to time t6 corresponding to the time at which a limit time period TP1 has passed since clock signal CLKCOMP rose.

In response to rise of the VALID signal at time t5, the first State signal changes into an H level. Furthermore, in response to the change of output signal LATCHOUT of comparator 11, output signal COMPOUT of SR latch circuit 12 changes. Successive approximation control circuit 20 updates comparison code CC based on output signal COMPOUT of SR latch circuit 12.

When a predetermined time period TP2 has passed since time t5 at which the VALID signal changed into an H level, clock generation circuit 18 changes the clock signal into an L level (time t7). Furthermore, when a predetermined time period TP3 has passed since clock signal CLKCOMP was changed into an L level, clock generation circuit 18 changes clock signal CLKCOMP into an H level (time t8). When clock signal CLKCOMP is changed into an H level, comparator 11 starts the comparison operation in the next second cycle.

When limit time period TP1 has passed at next time t9 since clock signal CLKCOMP rose, output signal Sub_in of limit time determination circuit 16 changes into an H level.

Thereby, the VALID signal changes into an H level (time t10). In the second cycle, the output of comparator 11 settles at time t11 that is after time t9 at which limit time period TP1 has passed.

In response to rise of the VALID signal at time t10, the second State signal changes into an H level. Although successive approximation control circuit 20 updates comparison code CC in accordance with output signal COMPOUT of SR latch circuit 12, output signal COMPOUT of SR latch circuit 12 is not changed at this point of time. In other words, successive approximation control circuit 20 updates comparison code CC using the previous comparison result of comparator 11 as a present comparison result.

In the following, similarly, when predetermined time period TP2 has passed since time t10 at which the VALID signal changed into an H level, clock generation circuit 18 changes the clock signal into an L level (time t12). When predetermined time period TP3 has passed since clock signal CLKCOMP was changed into an L level, clock generation circuit 18 changes clock signal CLKCOMP into an H level (time t13). When clock signal CLKCOMP is changed into an H level, comparator 11 starts the comparison operation in the next third cycle.

[Specific Example of AD Conversion]

FIG. 5 is a diagram for illustrating the conversion operation by the AD converter in the first embodiment. FIG. 5 shows an example of 5-bit AD conversion by a binary search method. The value of input signal VIN is assumed to be 8.1 in decimal number. Referring to FIGS. 2 and 5, first explained will be the case where no limit time period is set for the comparison operation.

In the first cycle, successive approximation control circuit 20 sets a comparison code at "10000". As a result of comparison by comparator 11, the DA conversion value (16 in decimal number) of the comparison code is larger than the input signal (8.1). Accordingly, successive approximation control circuit 20 decides the value of the most significant bit (MSB) at "0", and sets the comparison code in the next second cycle at "01000".

In the second cycle, the DA conversion value (8 in decimal number) of the comparison code is smaller than the input signal (8.1). Accordingly, successive approximation control circuit 20 decides the value of the second bit at "1", and sets the comparison code in the next third cycle at "01100".

In the third cycle, the DA conversion value (12 in decimal number) of the comparison code is larger than the input signal (8.1). Accordingly, successive approximation control circuit 20 decides the value of the third bit at "0", and sets the comparison code in the next fourth cycle at "01010".

In the fourth cycle, the DA conversion value (10 in decimal number) of the comparison code is larger than the input signal (8.1). Accordingly, successive approximation control circuit 20 decides the value of the fourth bit at "0", and sets the comparison code in the next fifth cycle at "01001".

In the fifth cycle, the DA conversion value (9 in decimal number) of the comparison code is larger than the input signal (8.1). Accordingly, successive approximation control circuit 20 decides the value of the least significant bit (LSB) at "0", and decides the final AD conversion value at "01000".

Then, the case where a limit time period is set for a comparison operation will be explained. Specifically, it is assumed that, in the above-mentioned second cycle, the limit time period has passed before the output of comparator 11 settles, and output signal Sub_in of limit time determination circuit 16 in FIG. 2 was asserted. In this case, successive approximation control circuit 20 decides the value of the second bit at "0" that is the same value as the most significant bit that is the bit before this second bit, and sets the comparison code in the next third cycle at "00100".

In the third cycle, the DA conversion value (4 in decimal number) of the comparison code is smaller than the input signal (8.1). Accordingly, successive approximation control circuit 20 decides the value of the third bit at "1", and sets the comparison code in the next fourth cycle at "00110".

In the fourth cycle, the DA conversion value (6 in decimal number) of the comparison code is smaller than the input signal (8.1). Accordingly, successive approximation control circuit 20 decides the value of the fourth bit at "1", and sets the comparison code in the next fifth cycle at "00111".

In the fifth cycle, the DA conversion value (7 in decimal number) of the comparison code is smaller than the input signal (8.1). Accordingly, successive approximation control circuit 20 decides the value of the least significant bit (LSB) at "1", and decides the final AD conversion value at "00111".

As described above, the difference of the AD conversion value between the case where a limit time period is set for the comparison operation and no limit time period is set for the comparison operation is only 1 LSB. If a comparison operation is further performed once or twice using the known redundant cycle technique, the AD conversion value can be correctly determined up to the least significant bit.

In addition, when the limit time period has passed before the output of comparator 11 settles, the previous comparison result does not necessarily have to be used as it is. In the above-described example, at the time when the value of the second bit is decided at "0", the final AD conversion value is set at "00111", and at the time when the value of the second bit is decided at "1", the final AD conversion value is set at "01000". Therefore, even if the value of the second bit is decided at "0" or "1", the difference of the final AD conversion value results in only 1 LSB.

Effects of the First Embodiment

According to the first embodiment, when the limit time period has passed since comparator 11 started a comparison operation, AD converter 10 operates so as to proceed to the next cycle even if the output of comparator 11 does not settle. As a result of this, even when the absolute value of the difference of input voltage of comparator 11 in a certain cycle (or the value of the differential input signal) becomes extremely small, the AD conversion value with a relatively small error can be obtained within a desired time period.

Second Embodiment

Figure 6:
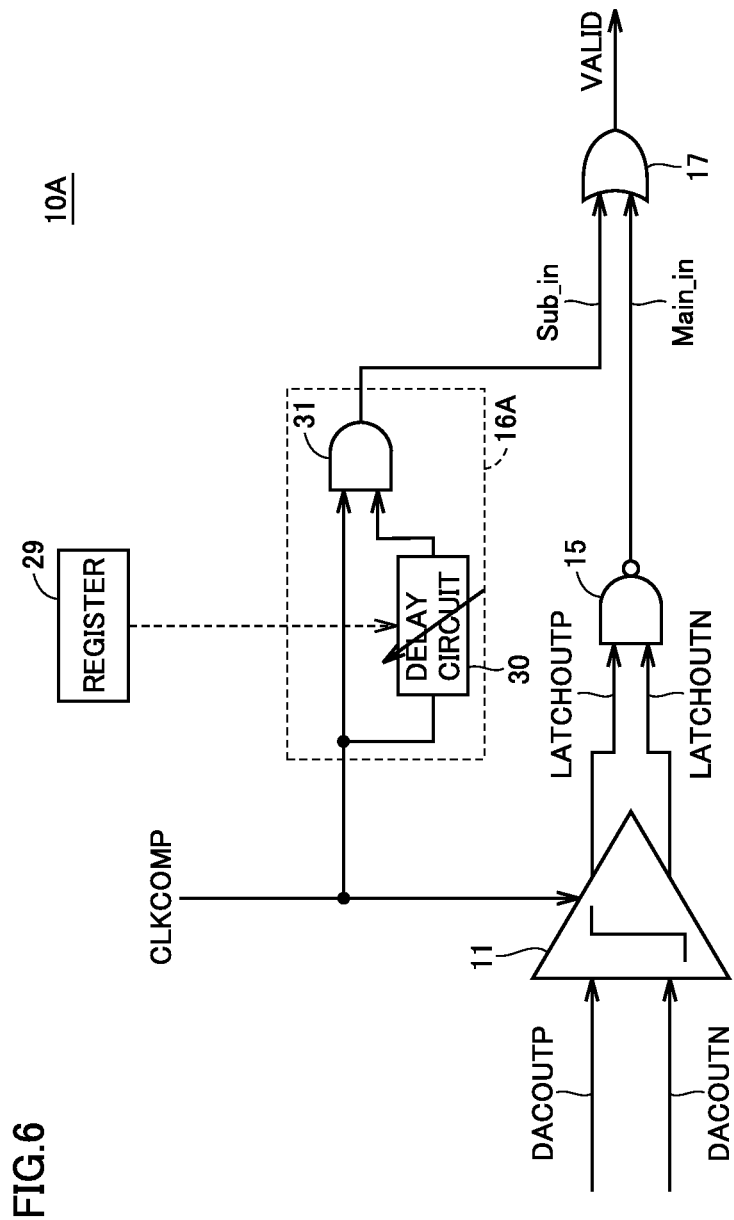
FIG. 6 is a diagram showing the configuration of a part of the AD converter according to the second embodiment.

FIG. 6 is a diagram showing the configuration of a part of the AD converter according to the second embodiment. An AD converter 10A according to the second embodiment has a configuration obtained by more specifically modifying limit time determination circuit 16 in FIG. 2. Referring to FIG. 6, limit time determination circuit 16A includes a delay circuit 30 and a logic gate (AND gate) 31.

Delay circuit 30 delays the timing of each of rise and fall of clock signal CLKCOMP. The delay time of delay circuit 30 corresponds to a limit time period TP1 described in the first embodiment. The delay time of delay circuit 30 can be adjusted in accordance with the value of each bit of register 29 provided in AD converter 10A. The contents of register 29 can be rewritten through MCU 2 in FIG. 1.

Logic gate (AND gate) 31 receives clock signal CLKCOMP and the output signal of delay circuit 30. When clock signal CLKCOMP is asserted (an H level) and the output signal of delay circuit 30 is asserted (an H level), output signal Sub_in of logic gate 31 is asserted (attains an H level).

Since other configurations of AD converter 10A are the same as those in FIG. 2, description thereof will not be repeated. In FIG. 6, the same components as those in FIG. 2 are designated by the same reference characters.

Figure 7:
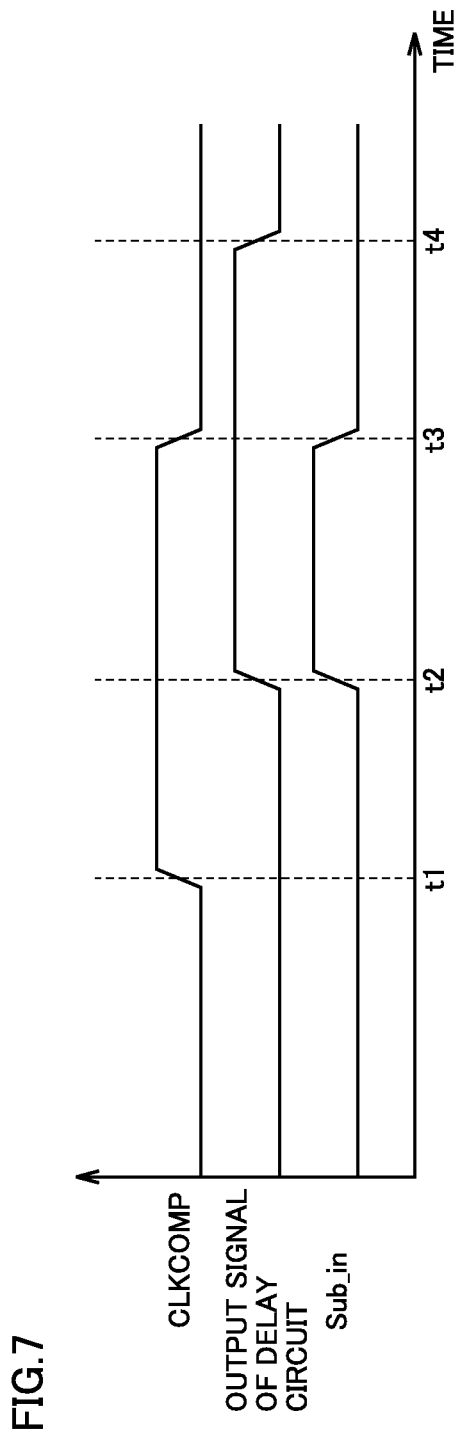
FIG. 7 is a diagram for illustrating the operation of a limit time determination circuit in FIG. 6.

FIG. 7 is a diagram for illustrating the operation of the limit time determination circuit in FIG. 6. Referring to FIGS. 6 and 7, it is assumed that clock signal CLKCOMP changes into an H level at time t1, and clock signal CLKCOMP changes into an L level at time t3. The rise and fall of the output signal of delay circuit 30 are delayed till time t2 and time t4, respectively.

Output signal Sub_in of logic gate 31 is obtained by performing an AND operation for clock signal CLKCOMP and the output signal of delay circuit 30. Therefore, output signal Sub_in of limit time determination circuit 16A is asserted at time t2 (changes into an H level) with a delay of the delay time of delay circuit 30 (corresponding to a limit time period) from the timing at which clock signal CLKCOMP is asserted (time t1). When clock signal CLKCOMP is negated at time t3, output signal Sub_in of limit time determination circuit 16A is negated immediately (changes into an L level). In other words, the same operation as that of limit time determination circuit 16 described with reference to FIG. 2 can be implemented.

Figure 8:
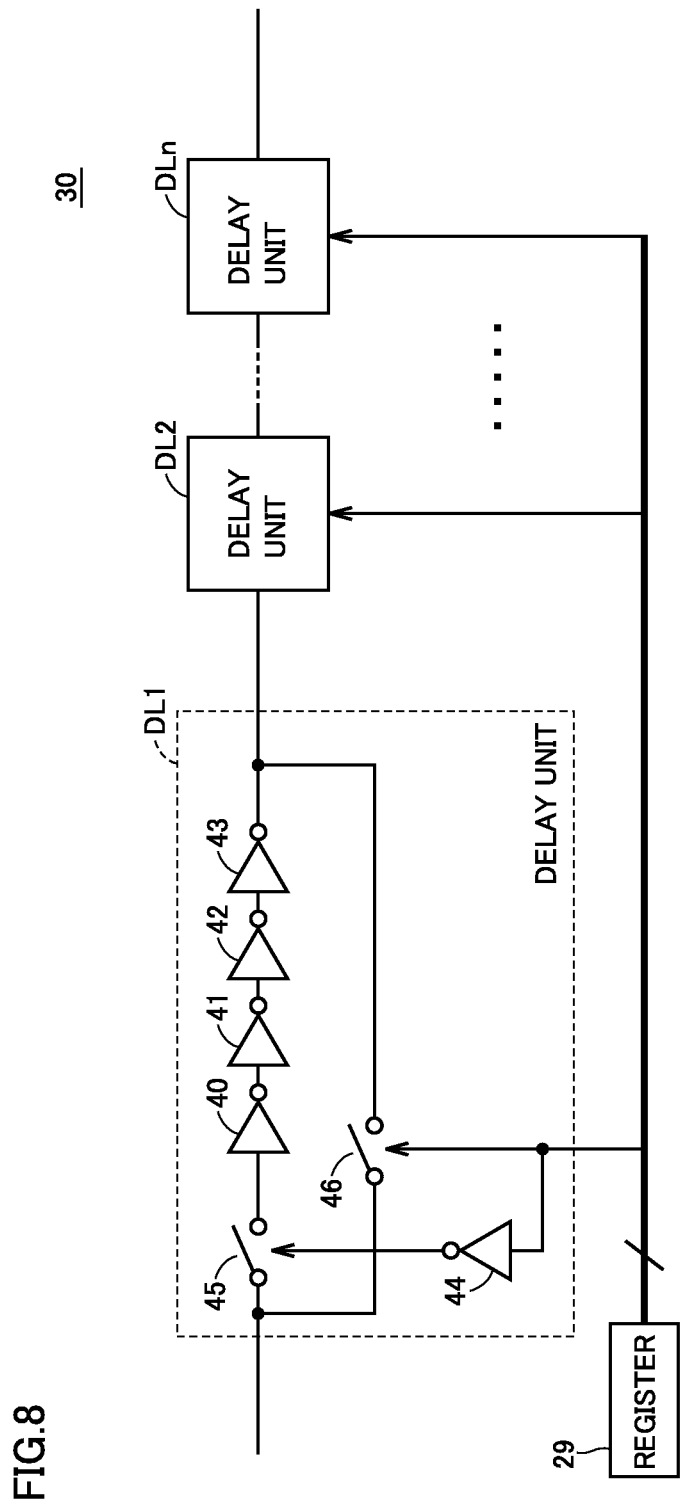
FIG. 8 is a diagram showing one example of the detailed configuration of a delay circuit in FIG. 6.

FIG. 8 is a diagram showing one example of the detailed configuration of a delay circuit in FIG. 6. Referring to FIG. 8, delay circuit 30 includes a plurality of delay units DL1, DL2, . . . , and DLn connected in series. Delay units DL1, DL2, . . . , and DLn correspond to bits of register 29, respectively. Each delay unit has the same configuration, and the delay time is controlled by the corresponding bit of register 29. FIG. 8 representatively shows the configuration of delay unit DL1.

Delay unit DL1 includes inverters 40 to 43 connected in series, switch elements (for example, MOS transistors) 45 and 46, and an inverter 44. Switch element 45 is connected in series to inverters 40 to 43, and turned ON or OFF in accordance with the logical value (1 or 0) of the corresponding bit of register 29. Switch element 46 is provided in a path by which inverters 40 to 43 are bypassed. Also, switch element 46 is turned ON or OFF in accordance with the value obtained by inverter 44 inverting the logical value of the corresponding bit of register 29. Therefore, the path passing through inverters 40 to 43 and the path bypassing inverters 40 to 43 can be switched in accordance with the value of the corresponding bit of register 29.

According to AD converter 10A in the above-described second embodiment, as in the case of the first embodiment, an AD conversion value with a relatively small error can be obtained within a desired time period even when the absolute value of the input potential difference of comparator 11 (that is, the value of differential input signal DACOUT) in a certain cycle becomes extremely small. Limit time determination circuit 16A used in AD converter 10A can be implemented by a relatively simple circuit configuration.

Third Embodiment

Figure 9:
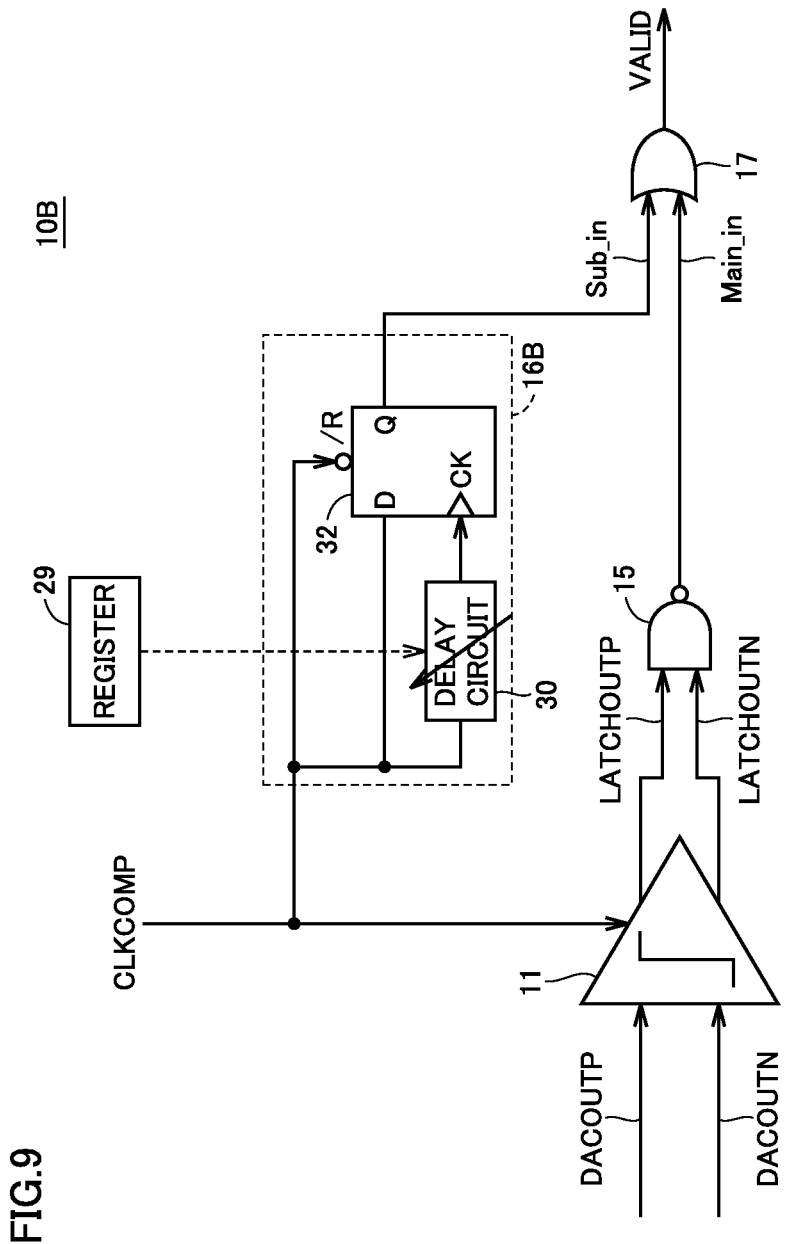
FIG. 9 is a diagram showing the configuration of a part of an AD converter according to the third embodiment.

FIG. 9 is a diagram showing the configuration of a part of an AD converter according to the third embodiment. An AD converter 10B according to the third embodiment has a configuration obtained by more specifically modifying limit time determination circuit 16 in FIG. 2. Referring to FIG. 9, limit time determination circuit 16B includes a delay circuit 30 and a D latch circuit 32.

Delay circuit 30 delays the timing of each of rise and fall of clock signal CLKCOMP. The configuration of delay circuit 30 is the same as that having been described with reference to FIG. 8. The delay time of delay circuit 30 can be adjusted in accordance with each bit value of register 29 provided in AD converter 10B. The contents of register 29 are rewritten through MCU 2 in FIG. 1.

Clock signal CLKCOMP is input into an input terminal D and an inversion reset terminal/R of D latch circuit 32 while the output signal of delay circuit 30 is input into clock terminal CK. Output signal Sub_in of limit time determination circuit 16B is output from an output terminal Q of D latch circuit 32.

According to the configuration of the above-described limit time determination circuit 16B, at the point of time when the delay time of delay circuit 30 (corresponding to a limit time period) has passed since clock signal CLKCOMP rose to an H level, clock signal CLKCOMP at an H level is output from output terminal Q as an output signal Sub_in. At the falling edge of clock signal CLKCOMP, the signal of an L level is input into inversion reset terminal/R, so that output signal Sub_in of an L level is immediately output. In other words, the same operation as in limit time determination circuit 16 having been described with reference to FIG. 2 can be implemented.

Since other configurations of AD converter 10B are the same as those in FIG. 2, description thereof will not be repeated. In FIG. 9, the same components as those in FIG. 2 are designated by the same reference characters.

According to AD converter 10B in the third embodiment described above, as in the first embodiment, an AD conversion value with a relatively small error can be obtained within a desired time period even when the absolute value of the input potential difference of comparator 11 in a certain cycle (that is, a value of the differential input signal) becomes extremely small. Since limit time determination circuit 16B used in AD converter 10B includes a D latch circuit, a scan chain for a scan test can be readily configured.

Fourth Embodiment

Figure 10:
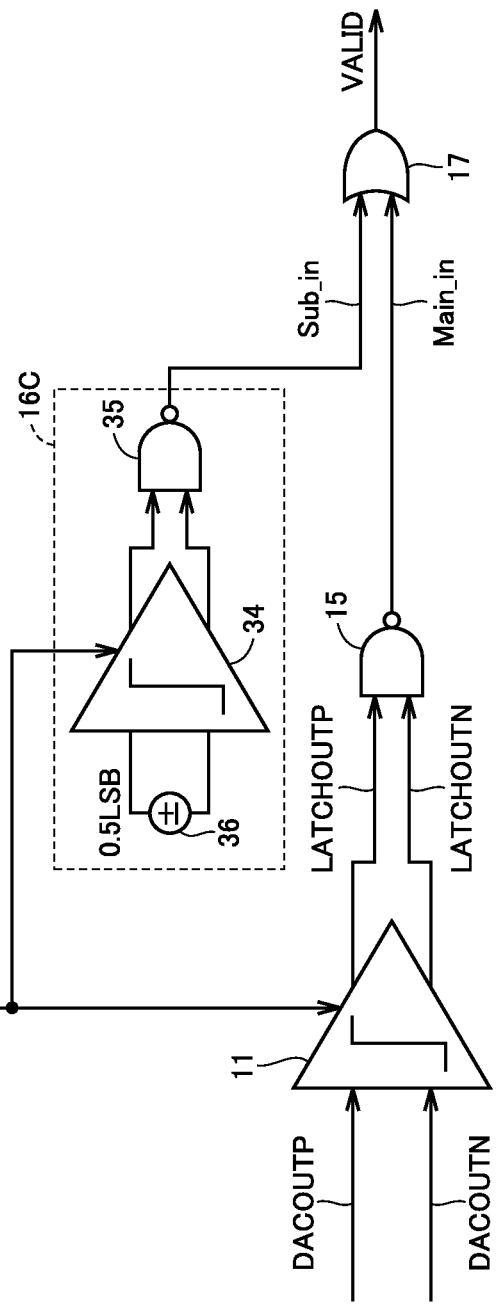
FIG. 10 is a diagram showing the configuration of a part of an AD converter according to the fourth embodiment.

FIG. 10 is a diagram showing the configuration of a part of an AD converter according to the fourth embodiment. An AD converter 10C according to the fourth embodiment has a configuration obtained by more specifically modifying limit time determination circuit 16 in FIG. 2.

Referring to FIG. 10, limit time determination circuit 16C includes: a replica comparator 34 having the same configuration as that of comparator 11; and a replica logic gate (NAND gate) 35 having the same configuration as that of logic gate (NAND gate) 15. As with comparator 11, replica comparator 34 is brought into a reset state (each of the positive phase and the negative phase of the differential output signal attains an H level) when clock signal CLKCOMP is negated. Then, when clock signal CLKCOMP is asserted, replica comparator 34 starts a comparison operation. The differential output signal of replica comparator 34 is input into replica logic gate 35, and the output signal of replica logic gate 35 is input into logic gate (OR gate) 17 as output signal Sub_in of limit time determination circuit 16C.

An input potential difference 36 of replica comparator 34 is set at the minimum potential difference that comparator 11 must determine. For example, input potential difference 36 is set at a value that is 0.5 times as that of LSB of the AD converter. Since the potential difference smaller than this minimum potential difference (0.5 LSB) is smaller than a quantization error, and therefore, does not have to be distinguished by comparator 11. When DA converter 14 includes a resistance ladder, 0.5 LSB of input potential difference 36 can be readily extracted by further resistance-dividing one tap of the resistance ladder.

According to limit time determination circuit 16C of the above-described configuration, the limit time period used as a reference as to whether to proceed to the next cycle or not is determined in accordance with input potential difference 36 of replica comparator 34 (for example, 0.5 LSB). Specifically, when the absolute value of differential input signal DACOUT of comparator 11 is larger than input potential difference 36 of replica comparator 34 (0.5 LSB), the output of comparator 11 settles before output signal Sub_in of limit time determination circuit 16C is asserted (that is, before the limit time period has passed). In contrast, when the absolute value of differential input signal DACOUT of comparator 11 is smaller than input potential difference 36 of replica comparator 34 (0.5 LSB), output signal Sub_in of limit time determination circuit 16C is asserted (that is, the limit time period has passed) before the output of comparator 11 settles.

Since other configurations of AD converter 10C are the same as those in FIG. 2, description thereof will not be repeated. In FIG. 10, the same components as those in FIG. 2 are designated by the same reference characters.

According to AD converter 10C in the fourth embodiment described above, as in the first embodiment, an AD conversion value with a relatively small error can be obtained within a desired time period even when the absolute value of the input potential difference of comparator 11 in a certain cycle (that is, the value of the differential input signal) becomes extremely small. Particularly, since the limit time period is determined in accordance with input potential difference 36 of replica comparator 34, adjustment of the delay time of delay circuit 30 as in the second and third embodiments is not required.

Fifth Embodiment

Figure 11:
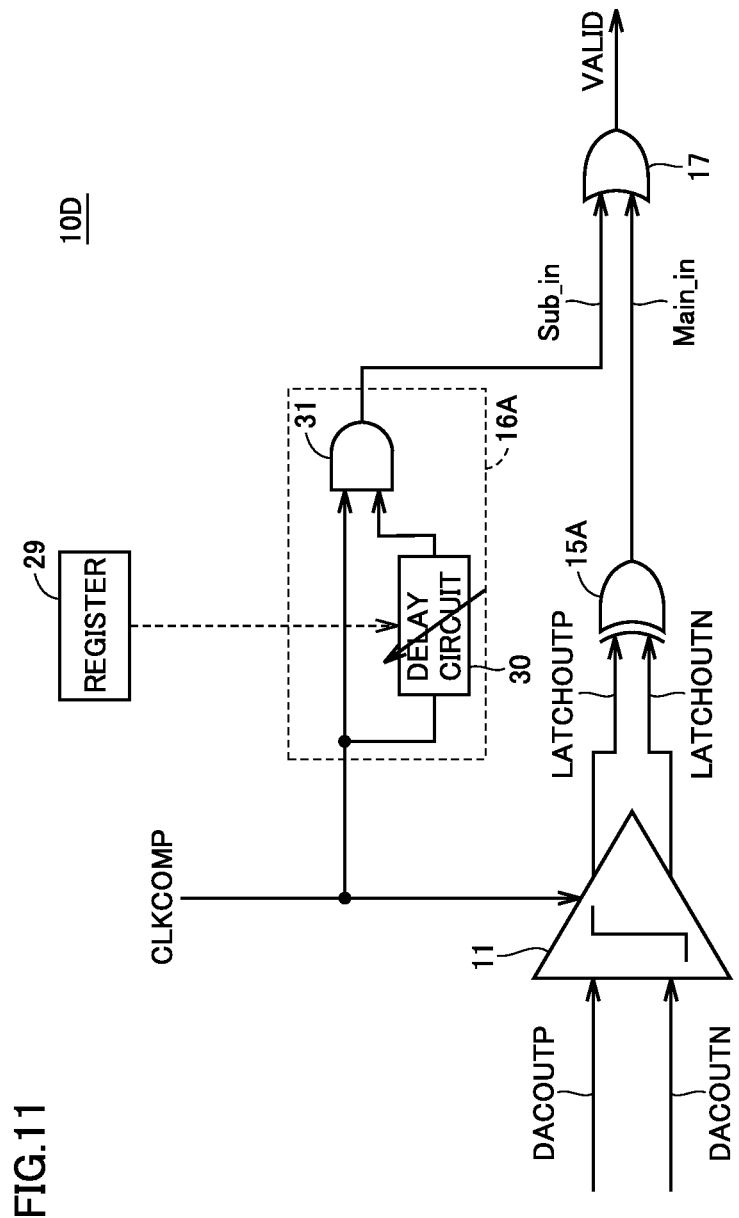
FIG. 11 is a diagram showing the configuration of a part of an AD converter according to the fifth embodiment.

FIG. 11 is a diagram showing the configuration of a part of an AD converter according to the fifth embodiment. An AD converter 10D according to the fifth embodiment is obtained by modifying AD converter 10A in FIG. 6. Specifically, AD converter 10D in FIG. 11 is different from AD converter 10A in FIG. 6 in that an exclusive-OR (EX-OR) gate 15A is provided in place of NAND gate 15.

AD converter 10A in FIG. 6 poses a problem that, when a common voltage of differential output signal LATCHOUT of comparator 11 changes to thereby cause each of positive phase signal LATCHOUTP and negative phase signal LATCHOUTN to attain an L level, output signal Main_in of logic gate (NAND gate) 15 is asserted, with the result that the VALID signal is to be asserted. On the other hand, according to an AD converter 10D in FIG. 11, even when the common voltage of differential output signal LATCHOUT of comparator 11 changes to thereby cause each of positive phase signal LATCHOUTP and negative phase signal LATCHOUTN to attain an L level, output signal Main_in of logic gate (EX-OR gate) 15A and the VALID signal are kept negated.

Since other configurations of AD converter 10D are the same as those in FIG. 6, description thereof will not be repeated. In FIG. 11, the same components as those in FIG. 6 are designated by the same reference characters. Also in AD converters 10, 10B and 10C shown in FIGS. 2, 9 and 10, respectively, an EX-OR gate can be employed in place of NAND gate 15.

Although the invention implemented by the present inventors have been specifically described based on the embodiments, it is obvious that the present invention is not limited to the above-described embodiments, but the features thereof can be variously modified without departing from the scope of the invention.

REFERENCE SIGNS LIST 1 semiconductor device, 10, 10A, 10B, 10C, 10D AD converter, 11 comparator, 12 SR latch circuit, 13 control circuit, 14 DA converter, 15 logic gate (NAND gate), 15A logic gate (exclusive-OR gate), 16, 16A, 16B, 16C limit time determination circuit, 17 OR gate, 18 clock generation circuit, 20 successive approximation control circuit, 29 register, 30 delay circuit, 32 D latch circuit, 34 replica comparator, 35 replica logic gate, CLKCOMP clock signal, TP1 limit time period, VIN (VINP, VINN) analog input signal, CC comparison code, Main_in output signal of NAND gate (EX-OR gate), Sub_in output signal of limit time determination circuit.

The invention claimed is:

1. A successive approximation type AD (Analog-to-Digital) converter comprising:
   a DA (Digital-to-Analog) converter for making a DA conversion of a comparison code;
   a comparator for comparing an analog input signal and said DA-converted comparison code; and
   a control circuit for updating, when an output of said comparator settles before a limit time period has passed since said comparator started a comparison operation, said comparison code on a basis of the settled output of said comparator, and updating, when said limit time period has passed before the output of said comparator settles, said comparison code not on a basis of a present output of said comparator.

2. The AD converter according to claim 1, wherein said control circuit includes:
   a first determination unit for outputting a first determination signal asserted when the output of said comparator settles;
   a second determination unit for generating a second determination signal asserted when said limit time period has passed since said comparator started the comparison operation; and
   a first control unit for updating said comparison code when at least one of said first and second determination signals is asserted.

3. The AD converter according to claim 2, wherein said comparator starts the comparison operation when a clock signal is asserted,
   said control circuit further includes a second control unit for generating said clock signal, and
   said second control unit is configured to negate said clock signal in response to assertion of at least one of said first and second determination signals, and to assert said clock signal when a predetermined time period has passed since said clock signal was negated.

4. The AD converter according to claim 3, wherein said second determination unit negates said second determination signal when said clock signal is negated.

5. The AD converter according to claim 4, wherein said second determination unit includes:
   a delay circuit for delaying timing of each of rise and fall of said clock signal by said limit time period; and a first logic gate for generating said second determination signal asserted when said clock signal is asserted and an output signal of said delay circuit is asserted.

6. The AD converter according to claim 4, wherein said second determination unit includes:
a delay circuit for delaying timing of each of rise and fall of said clock signal by said limit time period; and
a D latch circuit having: an input terminal for receiving said clock signal; an inversion reset terminal for receiving said clock signal; a clock terminal for receiving an output signal of said delay circuit; and an output terminal for outputting said second determination signal.

7. The AD converter according to claim 5, wherein a delay time of said delay circuit is adjustable in accordance with a set value of a register.

8. The AD converter according to claim 3, wherein said comparator is configured to:
output a comparison result by a differential signal formed of a positive phase signal and a negative phase signal;
fix each of said positive phase signal and said negative phase signal to a first logic level when said clock signal is negated; and
decide the output by changing one of said positive phase signal and said negative phase signal into a second logic level when said clock signal is asserted,
said first determination unit includes a second logic gate for generating said first determination signal, and
said second logic gate asserts said first determination signal when one of said positive phase signal and said negative phase signal is at said first logic level and the other of said positive phase signal and said negative phase signal is at said second logic level.

9. The AD converter according to claim 8, wherein said second determination unit includes:
a replica comparator that is identical in configuration to said comparator, and outputs, when a predetermined input voltage is input and said clock signal is asserted, a differential output signal according to the input voltage; and
a replica logic gate that is identical in configuration to said second logic gate, and generates said second determination signal based on the differential output signal of said replica comparator, and
said limit time period is determined in accordance with an input voltage of said replica comparator.

10. The AD converter according to claim 9, wherein the input voltage of said replica comparator is equal to one half of a voltage corresponding to a least significant bit of said AD converter.

11. The AD converter according to claim 8, wherein said second logic gate includes an exclusive-OR gate.

12. The AD converter according to claim 8, wherein said AD converter further includes an SR latch circuit into which said positive phase signal and said negative phase signal from said comparator are input,
an internal state of said SR latch circuit does not change when each of said positive phase signal and said negative phase signal is at said first logic level, and changes into a set state or a reset state in response to a change of one of said positive phase signal and said negative phase signal into said second logic level, and
said first control unit generates said comparison code, based on an output signal of said SR latch circuit.

13. The AD converter according to claim 6, wherein a delay time of said delay circuit is adjustable in accordance with a set value of a register.

\* \* \* \* \*